United States Patent
Becker

(10) Patent No.: US 7,627,062 B2
(45) Date of Patent: Dec. 1, 2009

(54) METHOD FOR EQUALIZATION OF A DATA SIGNAL TAKING INTO ACCOUNT A DISTURBANCE CHANNEL

(75) Inventor: Burkhard Becker, Ismaning (DE)

(73) Assignee: Infineon Technologies AG (DE)

( * ) Notice: Subject to any disclaimer, the term of this patent is extended or adjusted under 35 U.S.C. 154(b) by 609 days.

(21) Appl. No.: 11/359,017

(22) Filed: Feb. 22, 2006

(65) Prior Publication Data

US 2006/0193377 A1 Aug. 31, 2006

(30) Foreign Application Priority Data

Feb. 25, 2005 (DE) ................ 10 2005 008 792

(51) Int. Cl.
*H04B 1/66* (2006.01)

(52) U.S. Cl. .................................. 375/341

(58) Field of Classification Search ............. 375/341, 375/265; 714/792, 794, 795
See application file for complete search history.

(56) References Cited

U.S. PATENT DOCUMENTS 5,432,821 A * 7/1995 Polydoros et al. ........... 375/340
7,089,483 B2 * 8/2006 McEwen et al. ............ 714/795

FOREIGN PATENT DOCUMENTS

DE 103 23 407 A1 12/2004
DE 103 38 050 A1 3/2005

OTHER PUBLICATIONS

A.S. Ilango et al., "Near-Optimal Low Complexity Joint Estimation of Cochannel ISI Signals for Mobile Receivers", IEEE 49th Vehicular Technology Conference, Vo. 2, pp. 1330-1334, May 16-20, 1999.
H. Arslan et al., "Iterative Co-Channel Interference Cancellation in Narrowband Mobile Radio Systems", IEEE Emerging Technologies Symposium: Broadband, Wireless Internet Access, pp. 1-5, Apr. 10-11, 2000.
B. Friedrichs, "Kanalcodierung: Grundlagen und Anwendungen in modernen Kommunikationssystemen", Springer, pp. 279-283, 1995.

* cited by examiner

*Primary Examiner*—Khai Tran
(74) *Attorney, Agent, or Firm*—Dickstein Shapiro LLP

(57) ABSTRACT

A useful channel trellis diagram is processed in a method for equalization of a signal which is transmitted via a useful channel. A disturbance channel trellis diagram is then processed, with useful channel path information being used as a DF contribution. The useful channel trellis diagram is processed once again, using disturbance channel path information as the DF contribution. When the useful channel trellis diagram is being processed for the first time, access is made to input information which was obtained during the useful channel trellis diagram processing in the previous time unit.

19 Claims, 10 Drawing Sheets

PRIOR ART    FIG 1
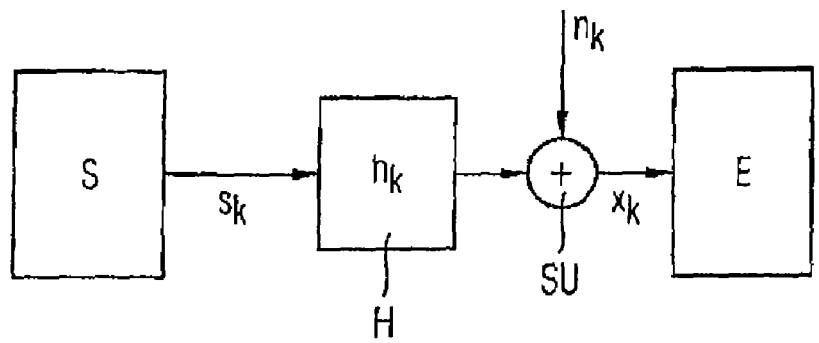
PRIOR ART    FIG 2
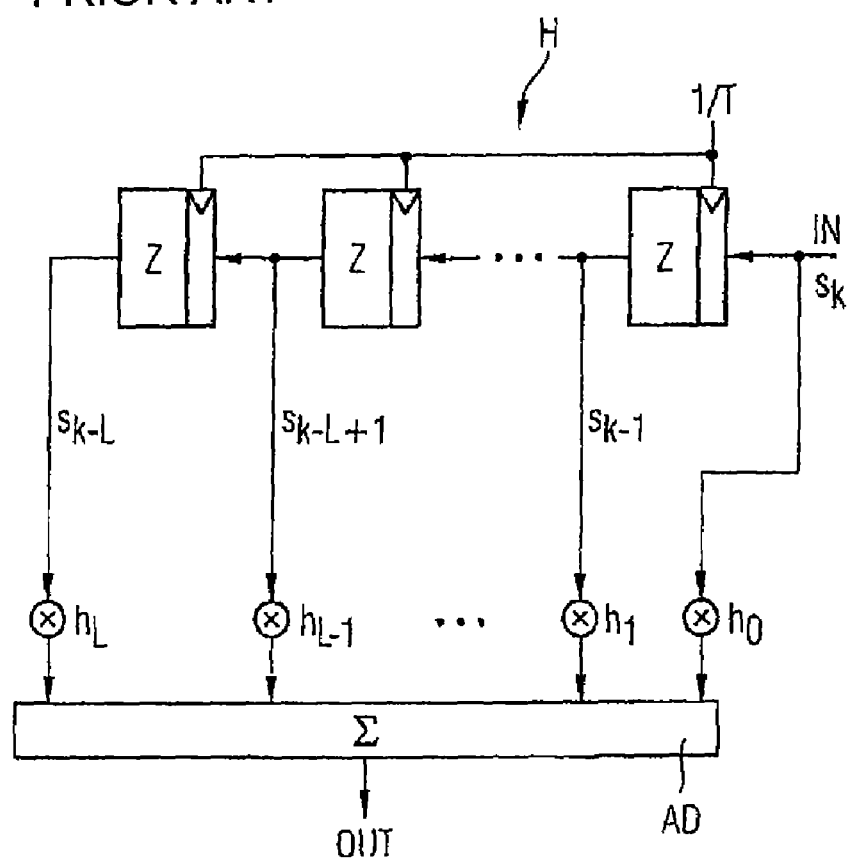

METHOD FOR EQUALIZATION OF A DATA SIGNAL TAKING INTO ACCOUNT A DISTURBANCE CHANNEL

PRIORITY

This application claims priority from German Patent Application No. DE 10 2005 008 792.2, which was filed on Feb. 25, 2005, and is incorporated herein by reference in its entirety.

TECHNICAL FIELD

The invention relates to a method for equalization of a signal which is transmitted via a useful channel, using the DF (decision feedback) method and taking into account at least one disturbance channel.

BACKGROUND

When radio signals are being transmitted between a transmitter and a receiver, various disturbance influences occur which must be taken into account in the signal detection process at the receiver end. First of all, the signal is subject to distortion which is caused by there generally being two or more possible signal propagation paths. Owing to reflection, scatter and diffraction of signal waves on obstructions, such as buildings, mountains and the like, the received field strength of the receiver is composed of a plurality of signal components which are generally of different strength and are subject to different delays. This phenomenon, which is known as multipath propagation, causes the distortion of the transmitted data signal that is known as intersymbol interference (ISI).

Other active subscribers represent a further cause of disturbances. The disturbances caused by these subscribers are referred to as multiple access interference (multi access interference: MAI). One frequently occurring scenario comprises the signal detection in the useful channel being seriously adversely affected by a dominant disturbance source or disturbance channel at that time.

First of all, only one channel will be considered, that is to say MAI will be ignored. This multipath transmission channel between the transmitter S and the receiver E can be modeled as a transmission filter H with a channel coefficient $h_k$, as is illustrated in FIG. 1. The transmitter S feeds transmission symbols $s_k$ into the transmission channel, that is to say the channel model transmission filter H. A model adder SU allows an additive noise contribution $n_k$ to be taken into account, which is added to the transmission symbols $S_k$, filtered with $h_k$, at the output of the channel model transmission filter H.

The index k denotes the discrete time in time units of the symbol clock. The transmission signals $s_k$ which are being filtered by the transmission filter H and on which noise is superimposed are received by the receiver E as the received signal $x_k$, for which:

$$x_k = \sum_{i=0}^{L} h_i s_{k-i} + n_k \quad (1)$$

where L represents the order of the transmission channel modeled by the filter H. As can be seen from equation (1), ISI is present since $x_k$ is dependent not only on $s_k$ but also on $s_{k-1}, \ldots, s_{k-L}$.

FIG. 2 shows the channel model transmission filter H. The filter H has a shift register comprising L memory cells Z. Taps (a total of L+1) of them are in each case located in front of and behind each memory cell Z and lead to multipliers which multiply the values of the symbols $s_k, s_{k-1}, \ldots, s_{k-L}$ which have been shifted into the shift register at the symbol clock rate $T^{-1}$ via an input IN by the corresponding channel impulse responses $h_0, h_1, \ldots, h_T$. An output stage AD of the filter H adds the outputs of the L+1 multipliers. This thus results in an output signal OUT corresponding to equation 1.

The memory content of the channel model shift register describes the state of the channel. The memory content of the first memory cell on the input side contains the symbol $s_{k-1}$ in the time unit k (which is multiplied by $h_1$), while the further memory cells Z are occupied with the symbols $s_{k-2}, s_{k-3}, \ldots, s_{k-L}$. The state of the channel in the time unit k is thus defined unambiguously by the details of the memory contents, that is to say by the L-tuple $(s_{k-L}, s_{k-L+1}, \ldots, s_{k-1})$.

In the receiver E, the received signal values $x_k$ are known as sample values, and the channel impulse responses $h_0, h_1, \ldots, h_L$ of the channel are estimated at regular time intervals. The object of the equalization process is to calculate the transmission symbols $s_k$ from this information. The following text is based on the use of a Viterbi equalizer for the equalization process.

Viterbi equalization is based on finding the shortest path through a state diagram of the channel, with this diagram being known as a trellis diagram. The channel states are plotted against the discrete time k in the trellis diagram. According to the Viterbi algorithm (VA), a branch metric, which represents a measure of the probability of the branch, is calculated for each possible branch between two states (previous state relating to the time unit k→destination state relating to the time unit k+1). The branch metrics are then added to the respective state metrics (which are frequently also referred to in the literature as path metrics) of the previous states (ADD). In the case of branches to the same destination state, the sums which are obtained in this way are compared (COMPARE). That branch to the destination state under consideration whose sum of the branch metric and state metric of the previous state is a minimum is selected (SELECT) and forms the extension of the path leading to this previous state to the destination state. These three basic VA operations are known as ACS-(ADD-COMPARE-SELECT-) operations.

While from the combination point of view, the number of paths through the trellis diagram increases exponentially as k rises (that is to say as time progresses), it remains constant for the VA. This is because of the selection step (SELECT). Only the selected path ("survivor") survives, and can be continued. The other possible paths are rejected. Recursive path rejection is the core concept of the VA and is an essential precondition of using computation techniques to cope with the problem of searching for the shortest path (also referred to as the "best path") through the trellis diagram.

The number of channel states (that is to say the number of occupancy options of the shift register H) in the trellis diagram, which is identical to the number of paths followed through the trellis diagram, is $p^L$. In this case, p denotes the significance of the data symbols under consideration. The computation complexity of the VA accordingly increases exponentially with L. Since L should correspond to the length of the channel memory of the physical propagation channel, the complexity for processing the trellis diagram rises as the channel memory of the physical propagation channel increases.

One simple method to reduce the computation complexity is to base the trellis processing on a short channel memory L.

However, this has a major adverse affect on the performance of the equalizer. A considerably more sensible measure to limit the computation complexity which does not seriously influence the quality of the equalizer is the decision feedback (DF) method. In the case of the DF method, the VA is based on a reduced trellis diagram, that is to say a trellis diagram in which only some of the $p^L$ channel states are taken into account, rather than all of them. When the trellis diagram is reduced to $p^{L_{DF}}$ trellis states ($L_{DF}<L$), the remaining $L-L_{DF}$ channel coefficients (which are not used for the definition of trellis states) are still taken into account by using them for the calculation of the branch metrics in the reduced trellis diagram.

A branch metric must be calculated both during the processing of the complete trellis diagram and during the processing of the reduced trellis diagram (the DF case) for each possible branch between two states. The branch metric is the Euclidean distance between the measured signal value or sample value $X_k$ and a reconstructed "hypothetical" signal value which is calculated and "tested" in the receiver with respect to the destination state, the branch from the previous state to the destination state and the path history, taking into account the channel knowledge.

In order to explain this, let us assume by way of example that p=2 (binary data signal), that is to say there are $2^L$ (DF case: $2^{L_{DF}}$) trellis states $(0, 0, \ldots, 0), (1, 0, \ldots, 0)$ to $(1, 1, \ldots, 1)$ comprising L tuples (DF: $L_{DF}$ tuples). Let us assume that one specific hypothetical previous state is defined by the shift register occupancy $(a_L, a_{L-1}, \ldots, a_1)$ (in the DF case, only the $L_{DF}$ right-hand bits $(a_{L_{DF}}, \ldots, a_1)$ of the shift register occupancy are used for the state definition). The hypothetically transmitted symbol (bit) 0 or 1 which leads from the previous state $(a_L, a_{L-1}, \ldots, a_1)$ in the time unit k to the destination state $(a_{L-1}, a_{L-2}, \ldots, a_0)$ in the time unit k+1 (DF: previous state $(a_{L_{DF}}, \ldots, a_1)$ to the destination state $(a_{L_{DF}-1}, \ldots, a_0)$) is denoted $a_0$. With or without DF, the branch metric $BM_k$ is:

$$BM_k = |\text{sample value} - \text{estimated signal value}|^2 \quad (2)$$

$$= \left| X_k - \left( \sum_{i=1}^{L} h_i(1-2\cdot a_i) + h_0(1-2\cdot a_0) \right) \right|^2 \text{ for } a_i = \{0, 1\}$$

The estimated signal value (also referred to in the following text as the estimated symbol) is a sum of products of a channel coefficient and a symbol. For the DF case, the term $$\sum_{i=1}^{L} h_i(1-2\cdot a_i)$$

can also be split into a trellis contribution and a DF contribution:

$$BM_k = \quad (3)$$

$$\left| X_k - \left( \underbrace{\sum_{i=L_{DF}+1}^{L} h_i(1-2\cdot a_i)}_{DF\ contribution} + \underbrace{\sum_{i=1}^{L_{DF}} h_i(1-2\cdot a_i)}_{trellis\ contribution} + \underbrace{h_0(1-2\cdot a_0)}_{hyp.symb.contribution} \right) \right|^2$$

This means that the estimated symbol comprises two (in the DF case: three) contributions: a contribution which is defined by the hypothetically transmitted symbol $a_0$ for the branch from the time unit k to the time unit k+1, the trellis contribution, which is given by the previous state with respect to the time unit k in the trellis diagram, and, in the DF case, the DF contribution is also added to this, because of the reduced trellis states.

With or without DF, the branch metric $BM_k$ is always the same. The computation saving in the case of VA with DF results, as already mentioned, from the smaller number $2^{L_{DF}}$ of trellis states to be taken into account in the processing of the trellis diagram, that is to say from the reduction in the trellis diagram.

If, furthermore, it is also intended to consider a disturbance channel (that is to say a second multipath transmission channel) for the equalization of a data signal, then joint VA equalization must be carried out on both channels (useful channel and disturbance channel). An overall trellis diagram which includes the states of both channels is set up for this purpose: one example: if p=2 (binary data signal) and L=4 for both channels, the trellis diagram for the useful channel has 16 states, and the trellis diagram for the disturbance channel likewise has 16 states. The "combinational" overall trellis diagram that is used as the basis for the joint VA equalization of both signals then comprises 16×16=256 states. If an additional DF bit is taken into account in each case (that is to say L=5, $L_{DF}$=4), the overall trellis diagram still has 256 states, but two more DF bits (one each for each channel) are also added as the DF contribution in the calculation of the branch metrics.

The complexity for processing the overall trellis diagram is greater by a factor of 16 than the complexity for processing the trellis diagram for the useful channel on its own. When processing the trellis diagram under the control of a DSP (digital signal processor), a solution such as this leads to a very high MIPS load (MIPS: million instructions per second) on the DSP, so that no other applications can run on the DSP or can no longer run in an acceptable time. For a useful signal which is transmitted using the EDGE (enhanced data rates for GSM evolution) Standard (with p=8), equalization taking account of an interference source in the use of the overall trellis diagram is no longer possible in mobile radio practice, because of the excessively high DSP load.

If a further (that is to say a second) disturbance source is added, the overall trellis diagram already covers 16×16×16=4096 states (it is likewise assumed that p=2 and L=4 for the second disturbance source). In this case as well, the computation complexity for conventional VA equalization on the basis of an overall trellis diagram such as this can no longer be kept with.

It is already known from the document DE 103 23 407 A1 for a disturbance signal to be taken into account for equalization of a signal transmitted via a useful channel, in such a way that one trellis diagram for the disturbance channel and one trellis diagram for the useful channel are processed per time unit. The useful channel equalization is carried out using a DF method. In this case, the influence of the disturbance channel on the useful channel equalization is taken into account by a DF contribution, which is based on the best path determined during the equalization of the disturbance channel.

The procedure described in the document DE 103 23 407 A1 for useful channel equalization involving a disturbance channel will be explained with reference to FIG. 3. The illustration shows the processes P0 and P1 to be carried out in the time unit k. The disturbance channel is equalized for the time unit k in the process P0. A trellis diagram is used which includes exclusive states of the disturbance channel. The equalization can be carried out with or without DF. The disturbance channel equalization (the process p0) results in the best path of the disturbance channel for the time unit k. This best path of the disturbance channel can now be used as an additional DF contribution for the equalization of the useful channel (the process P1). The branch metric values $BMU_k(v(k) \rightarrow v'(k+1))$ for the useful channel are then calculated using the following equation:

$$BMU_k = \left| x_k - \left( \underbrace{\sum_{i=0}^{L^I} h_{Ii}(1 - 2 \cdot a_{Ii})}_{DF\,contribution\,disturbance\,source} + \underbrace{\sum_{i=L_{DF}^U+1}^{L^u} h_{Ui}(1 - 2 \cdot a_{Ui})}_{DF-contribution\,user} + \right. \right.$$

$$\left. \left. \underbrace{\sum_{i=1}^{L_{DF}^U} h_{Ui}(1 - 2 \cdot a_{Ui})}_{trellis\,contribution\,user} + \underbrace{h_{U0}(1 - 2 \cdot a_{U0})}_{hyp.symb.contribution\,user} \right) \right|^2 \quad (4)$$

In this case, $h_{Ui}$, $i=0, 1, \ldots, L^U$ denote the channel coefficients for the useful channel, $h_{Ii}$, $i=0, 1, \ldots, L^I$, the channel coefficients for the disturbance channel, $a_{Ui}$ the bits of the useful channel, $a_{Ii}$ the bits of the best path of the disturbance channel, $L^U$, the order of the model filter for the useful channel, $L^I$ the order of the model filter for the disturbance channel, and $L_{DF}^U$ the number of trellis bits for the useful channel. In comparison to the equation (3), it is clearly evident that the branch metric values include a further DF contribution ("DF contribution disturbance source"), which results from the best disturbance source path determined in the process P0.

The alternating processes P0 and P1 are carried out in each time unit k. It should be noted that the best path in the disturbance channel (in the process P0) is in each case calculated for the same time unit k as the branch metric values in the useful channel (process P1). This ensures that the contribution of the current (time unit k) symbol in the disturbance channel is also taken into account for the equalization of the useful channel in the time unit k. The major difference in comparison to the scenario without any disturbance sources is thus the addition of the best disturbance channel path to the respective useful channel path, in the form of DF bits (that is to say bits which are used only in the calculation of the branch metric values and not for state definition in the useful channel trellis diagram). The processing of the disturbance channel trellis diagram (the process P0) is in contrast carried out without taking into account any DF contribution from the useful channel trellis processing.

FIG. 4 shows a further option for equalization of a useful channel in the presence of a disturbance source. In the case of the method shown in FIG. 4, which is described in the document DE 103 38 050 that was not published prior to this, the useful channel trellis diagram is processed twice and the disturbance channel trellis diagram is processed once per time unit k. Equalization of the useful channel (for the time unit k) is carried out at the start (the process P0). In this case, no DF contribution from another channel is taken into account. During the useful channel equalization that is carried out in the process P0, the best useful channel path is calculated for the time unit k (the best path for the time unit k, based on the normal definition, is that path which leads to the destination state (time unit k+1) which has the least state metric during processing of the trellis diagram). This best useful channel path as determined in the process P0 is now used as the "other channel DF contribution" for the DF equalization of the disturbance channel for the same time unit k. The influence of the useful channel is taken into account in this way in the equalization of the disturbance channel. The best path of the disturbance channel which was determined during the equalization of the disturbance channel (the process P1) is then used—still for the time unit k—for equalization of the useful channel once again (the process P2). This second equalization of the useful channel for the time unit k is significantly better than the first equalization carried out in the process P0, since it takes account of the influence of the disturbance channel. The quality of the useful channel equalization in the process P2 (FIG. 4) is also significantly better than the useful channel equalization in the process P1 shown in FIG. 3, since the best path determined for the time unit k in the disturbance channel is more reliable owing to the consideration of the disturbance channel by the useful channel in the process P1.

It should be noted that both the method illustrated in FIG. 3 and that illustrated in FIG. 4 result in considerable computation savings in comparison to the conventional method (processing of an overall trellis diagram which includes the combined disturbance source/user states). In the case of processing illustrated in FIG. 3, only 2 (the number of the trellis diagram)×16 (the number of the states in a trellis diagram)=32 states need be taken into account per time unit. In the case of the processing illustrated in FIG. 4, the complexity is increased to 3 (the number of trellis diagrams)×16 (the number of the states in one trellis diagram)=48 states, which must be taken into account in the trellis processing operations per time unit. In both cases (FIGS. 3 and 4), considerably fewer states are thus considered—and therefore considerably fewer paths and state metrics are calculated—than in the case of the conventional method that has been explained (processing of the overall trellis diagram with 256 states).

The invention is based on the object of specifying a simple and powerful method for equalization of a signal transmitted via a useful channel, based on the DF method and taking into account at least one disturbance channel.

SUMMARY

The object on which the invention is based is achieved by the features of the independent claims.

According to a first aspect of the invention, in order to equalize a signal that is transmitted via a useful channel taking into account at least one disturbance channel, (a) one trellis diagram of the useful channel is processed per time unit, (b) one trellis diagram of the disturbance channel is processed per time unit, with a DF contribution which is used in the processing of the trellis diagram of the disturbance channel containing information, determined in step (a), of the useful channel, and (c) the trellis diagram of the useful channel is processed once again with a DF contribution, which was used when the trellis diagram of the useful channel was processed once again, containing information, determined in step (b), of the disturbance channel. In this case, the input information is accessed in step (a) during the processing of the trellis diagram of the useful channel, which input information was determined when the trellis diagram of the useful channel was processed once again in step (c) in the previous time unit. In this case, the input information is preferably path information and/or state metric values.

Using the input information determined in step (c) (in particular path information and/or state metric values) for the processing of the trellis diagram of the useful channel in step (a) in the next time unit results in the step (a) using input variables (specifically the input information that is to say in particular path information and/or state metric values) in which the influence of the disturbance channel has already been taken into account. In other words, the disturbance suppression that is achieved in the process P2 in the time unit k (see FIGS. 7 and 8) is transferred to the process P0 for the next time unit k+1. The two processes P0 and P2 (step (a) and step (c) of the useful channel equalization) are thus coupled. This coupling results in an improvement in the performance of the equalization with respect to the bit error rate and the frame error rate. Optimally, both the path information and the state metric values are transferred as input information items from the process P2 (time unit k) to the process P0 (time unit k+1).

One particularly advantageous method variant is characterized in that the path information and/or state metric values which was/were calculated during the processing of the trellis diagram of the useful channel in step (a) are/is rejected without being stored. This rejection of these variables is possible since they are no longer required for the further processing in the next time unit in the step (a) (the process P0). Furthermore, the rejection of these variables makes it possible to save a memory area (memory area S1_2 in FIG. 8).

In particular, the method according to the invention is characterized in that, in step (b) state metric values and/or path information relating to the previous states of the trellis diagram of the disturbance channel are/is read from a first disturbance channel memory area, and in that calculated state metric values and/or path information relating to the destination states of the trellis diagram of the disturbance channel are/is written to a second disturbance channel memory area. In step (c), the state metric values and/or path information relating to the previous states of the trellis diagram of the useful channel are/is read from a first useful channel memory area, and calculated state metric values and/or path information relating to the destination states of the trellis diagram of the useful channel are/is written to a second useful channel memory area. In step (a), the state metric values and/or path information relating to the previous states of the trellis diagram of the useful channel are/is then read from the second useful channel memory area. Since the write memory area that was used in the step (c) (the process P2) is identical to the read memory area which is used in the step (a) (the process P0), this saves memory area in comparison to the conventional solution (see FIG. 7). Furthermore, as already mentioned, no write operations may be carried out in the process P0 (step (a)).

According to a second aspect of the invention, (a) a trellis diagram of the disturbance channel for a time unit under consideration is processed for equalization of a signal transmitted via a useful channel, based on the DF method and taking into account at least one disturbance channel per time unit. Furthermore, (b) a trellis diagram of the useful channel is processed for the time unit delayed by a first predetermined time delay with respect to the time unit under consideration, with a DF contribution which was used during the processing of the trellis diagram of the useful channel including path information of the disturbance channel which was determined in step (a) and occurred at a time equivalent to at least the first predetermined time delay before this.

The use of path information which has been traced back by at least the first predetermined time delay for the disturbance channel in the DF contribution which is used during the processing of the trellis diagram of the useful channel likewise results in a performance improvement in the equalization with respect to the achievable bit error rate or frame error rate. This is because the path information that has been traced back is more reliable than path information for the same time unit which is obtained without any delay between the processing of the trellis diagram of the disturbance channel and the processing of the trellis diagram of the useful channel. The improvement in the equalization performance is based on the phenomenon of path combination, that is to say on the same phenomenon that is used for conventional Viterbi equalization. This phenomenon states that all of the paths which are followed through the trellis diagram are combined in the past (that is to say after being traced back over the so-called path combination length). Path sections of a current path which are located further back are thus more reliable in the current path header. Since the advanced processing of the disturbance channel can access correspondingly previous path information of the disturbance channel for the DF contribution, which is referred to in equation (4) as "DF contribution disturbance source" during the processing of the useful channel, the greater accuracy of this term results in the improvement of the calculation of the branch metric values as stated in the equation (4).

According to the second aspect of the invention, the method can also be applied to the processing of more than two trellis diagrams per time unit. According to one particularly preferred refinement of the invention, in a step before the step (a), either the trellis diagram of the useful channel is processed for the first time, or a trellis diagram of a further disturbance channel is processed for the time unit which preceded the time unit under consideration by a second predetermined time delay. In this case, in step (a), a DF contribution which was used during the processing of the trellis diagram of the disturbance channel includes path information, which was determined in the step (i) and occurred at a time equivalent to at least the second predetermined time delay before this, of the channel (useful channel or further disturbance channel) processed in the step (i). The latency in the equalization of the useful channel is in this case increased to the sum of the first and of the second predetermined time delay. In this case, it is, of course, possible for the first and the second predetermined time delays to be identical.

The DF contribution which is used for the processing of the trellis diagram of the useful channel preferably contains that path information of the disturbance channel which has been traced back through precisely the first predetermined time delay. This ensures that the current (that is to say likewise for the time unit k) symbol of the disturbance channel is taken into account in the useful channel equalization for the time unit k.

The first and/or the second time delay is preferably between one and ten time units, in particular between two and four time units. Empirical values for the time delay in the region of two or four time units are themselves adequate to achieve a significant improvement in the equalization performance with respect to the bit error rate or the frame error rate.

BRIEF DESCRIPTION OF THE DRAWINGS

The invention will be explained in the following text using exemplary embodiments and with reference to the drawings, in which:

FIG. 1 shows a schematic illustration of a model of the physical transmission channel;

FIG. 2 shows the configuration of a model filter for modeling of a physical transmission channel;

DETAILED DESCRIPTION

Figure 5:
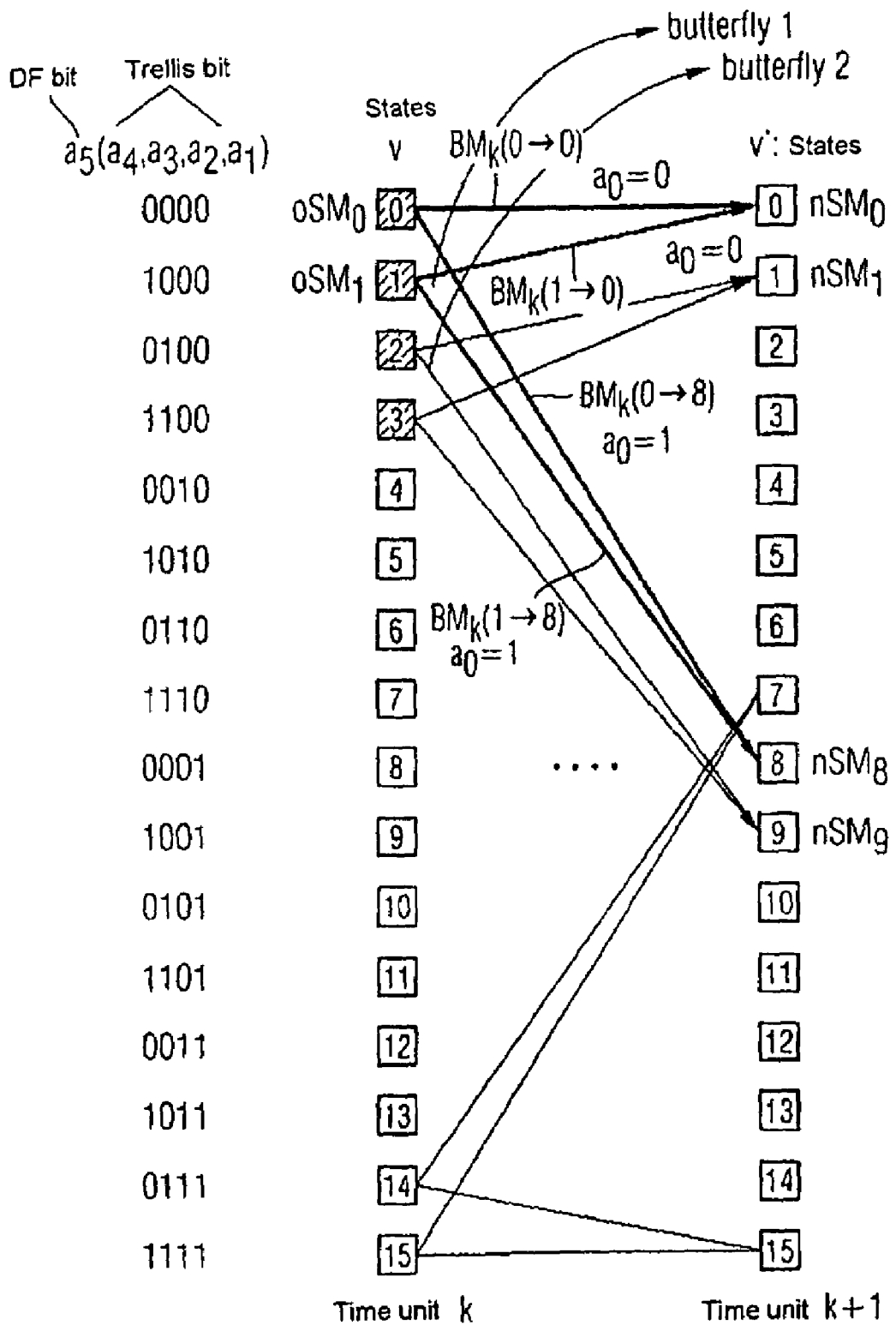
FIG. 5 shows a detail from a trellis diagram in order to explain the processing of a trellis diagram for p=2, L=5 and $L_{DF}=4$.
Figure 6:
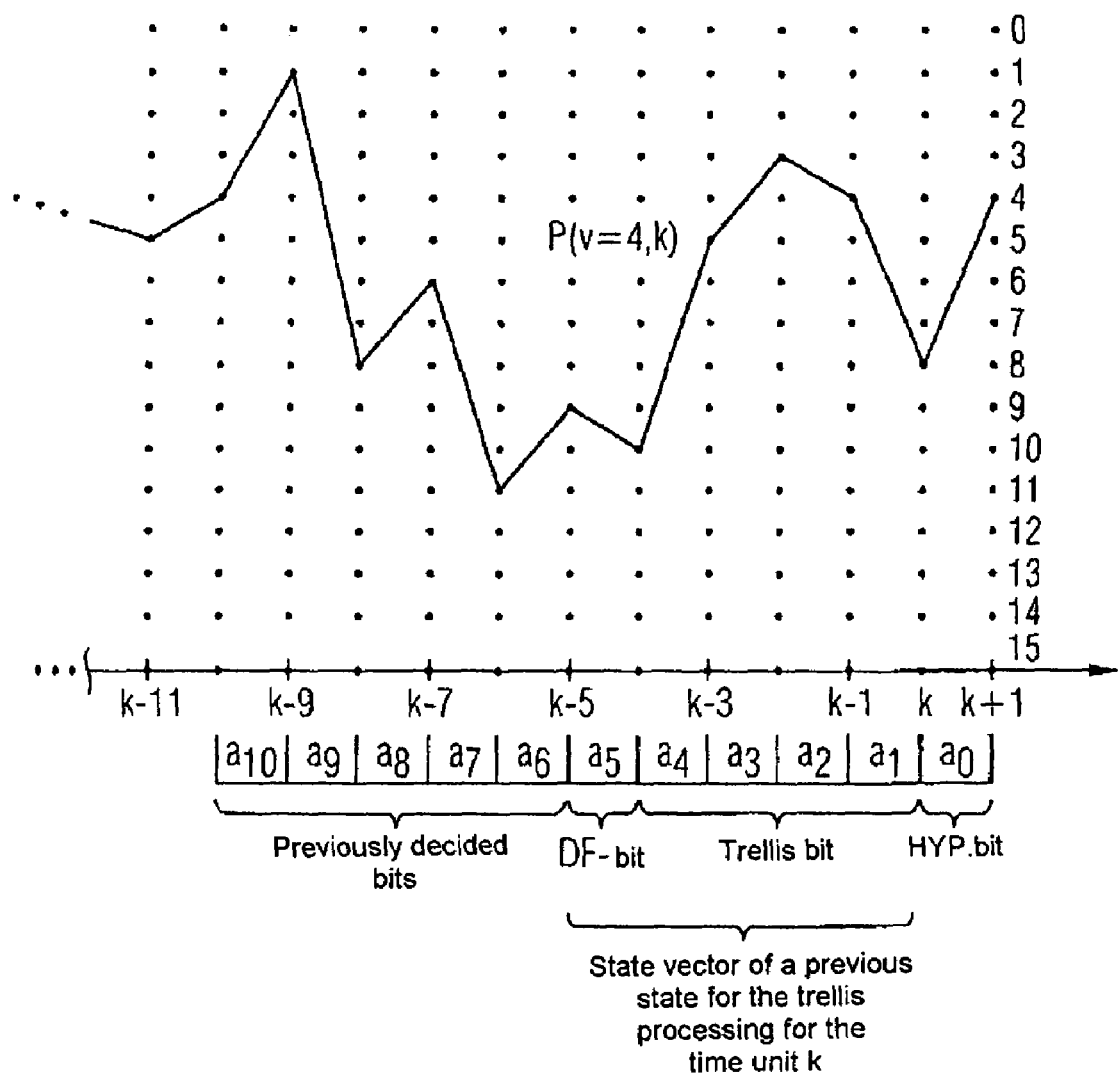
FIG. 6 shows a schematic illustration of a path which was determined during the processing of the trellis diagram as shown in FIG. 5 and which leads to a specific state in the time unit k+1, as well as an indication of an associated state vector.

FIGS. 5 and 6 will be used to explain an example of Viterbi equalization based on the DF method. The case where p=2 will be considered by way of example. A two-value symbol alphabet is used in the GSM (Global System for Mobile Communications) mobile radio standard. Furthermore, the equalization of the channel under consideration (disturbance channel or useful channel) is likewise, by way of example, based on a channel model filter H as shown in FIG. 2, containing L=5 memory cells. Each state in the trellis diagram is defined by 4 bits ($L_{DF}=4$). In consequence, the trellis diagram for both the disturbance channel and that for the useful channel each have $2^4=16$ states.

FIG. 5 shows a detail of the associated trellis diagram (which applies both to the useful channel and to the disturbance channel) with 16 states. This considers the processing of the trellis diagram in the time unit k, considering branches between previous states in the time unit k and destination states for the time unit k+1. First of all, the processing of a trellis diagram such as this will be explained in a general form, without going into the consideration according to the invention of the other channel. The states are annotated with the index v and are represented by the small boxes, numbered successively from 0 to 15, over the time units k and k+1. The first 4 memory cells of the model filter H in each time unit can thus assume one of 16 possible channel states.

It is assumed that the ACS operations relating to the time unit k have already been carried out. A state metric has then already been calculated for each of the 16 states for the time unit k. Furthermore, the path leading to each of these states (sequence of previous states) is fixed. The "old" state metric value calculated for the state v, v=0, . . . , 15 in the time unit k is denoted by $oSM_v$.

The object of the ACS operation is to calculate a new state metric value for each destination state v in the time unit k+1. The new state metric values calculated for the destination states in the time unit k+1 are denoted $nSM_v$, v=0, . . . , 15.

The new state metric values for the destination states are calculated in accordance with the known VA as follows:

Let us first of all consider the destination state v=0. With the value of the hypothetical bit $a_0=0$, the destination state v=0 for the time unit k+1 is reached either from the state v=0 or from the state v=1 for the time unit k. In order to decide which is the more probable of these two previous states and thus the more probable of the two possible branches, the sums $oSM_0+BM_k(0\rightarrow 0)$ and $oSM_1+BM_k(1\rightarrow 0)$ are formed (ADD operation). In this case, $BM_k(0\rightarrow 0)$ denotes the branch metric value associated with the branch from the previous state v=0 to the destination state v=0, and $BM_k(1\rightarrow 0)$ denotes the branch metric value associated with the branch from the previous state v=1 to the destination state v=0.

The smaller of the two sum values is determined (COMPARE operation), and becomes the new state metric value $nSM_0$ of the destination state v=0 for the time unit k+1, that is to say: $nSM_0=\min(oSM_0+BM_k(0\rightarrow 0); oSM_1+BM_k(1\rightarrow 0))$. The associated branch is selected (SELECT operation) as the more probable of the two possible branches. The more probable branch as well as the more probable previous state are determined in this way for each destination state v=0, . . . , 15 for the time unit k+1. One ACS operation therefore must be carried out for each destination state.

Figure 3:
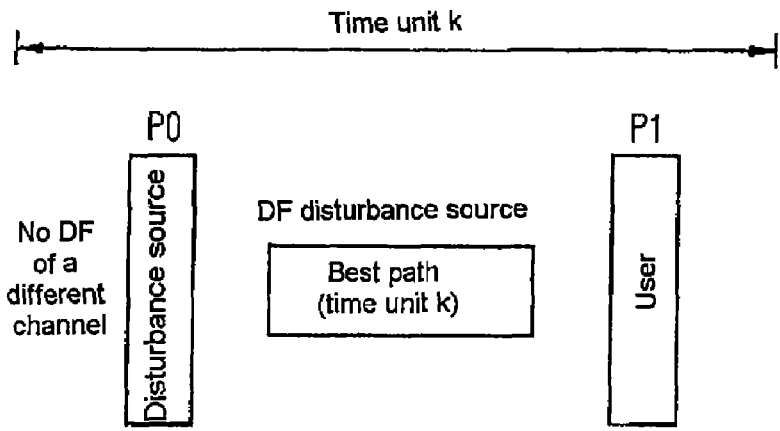
FIG. 3 shows an illustration to explain the processing of disturbance channel and useful channel trellis diagrams in the time unit k according to the prior art.

The two other possible branches from the previous state v=0,1 for the time unit k likewise lead to the same destination state, to be precise v=8. The branches $0\rightarrow 0$ $1\rightarrow 0$, $0\rightarrow 8$, $1\rightarrow 8$ are referred to as the butterfly 1 (because their shape is similar to that of a butterfly). A second butterfly—butterfly 2—is defined by the branches $2\rightarrow 1$, $3\rightarrow 1$ and $2\rightarrow 9$, $3\rightarrow 9$. An eighth butterfly is also shown in FIG. 3, and is defined by the branches $14\rightarrow 7$, $14\rightarrow 15$ and $15\rightarrow 7$, $15\rightarrow 15$.

"Processing of the trellis diagram" means carrying out all of the ACS operations for one specific time unit k. The ACS operations are preferably carried out butterfly-by-butterfly.

The states of the trellis diagram v=0, . . . , 15 are defined in a bit-inverted sequence:

state v=0: 0000 state v=1: 1000 state v=2: 0100

. . .

state v=14: 0111 state v=15: 1111.

As can be seen from FIG. 5, the states are composed of the hypotheses for the last 4 bits $a_4$, $a_3$, $a_2$, $a_1$ entered in the channel model filter H. A bit $a_5$ (or else a plurality of such bits) which has already been entered in the channel model filter H (hypothetically) can be used as a DF bit for the channel under consideration (useful channel or disturbance channel). It is not used for the definition of the trellis states for this channel.

The ACS operations which have been explained with reference to FIG. 5 are processed time unit by time unit, thus resulting in a path being drawn through the trellis diagram for each state v=0, ..., 15. FIG. 6 shows, in an abstracted form, a path P(v=4, k) which leads to the state v=4 for the time unit k+1 when the trellis diagram is processed for the time unit k. The respective hypothetical bits $a_{10}, \ldots, a_5, a_4, a_3, a_2, a_1, a_0$ are indicated underneath the trellis diagram, that is to say the branches from which the specific path P(v=4, k) is composed. The bits which describe the trellis state as well as the earlier DF bits are referred to as the state vector, that is to say, with respect to a previous state in the time unit k, the state vector taking into account a single DF bit is $a_5, a_4, a_3, a_2, a_1$. With respect to the processing of the trellis diagram for the k-th time unit, the state vector from the destination state is v=4, $a_4$, $a_3, a_2, a_1, a_0$, where $a_4$ represents the DF bit. Since one path leads to each state v=0, ..., 15, there are 16 state vectors of the form indicated above.

Figure 4:
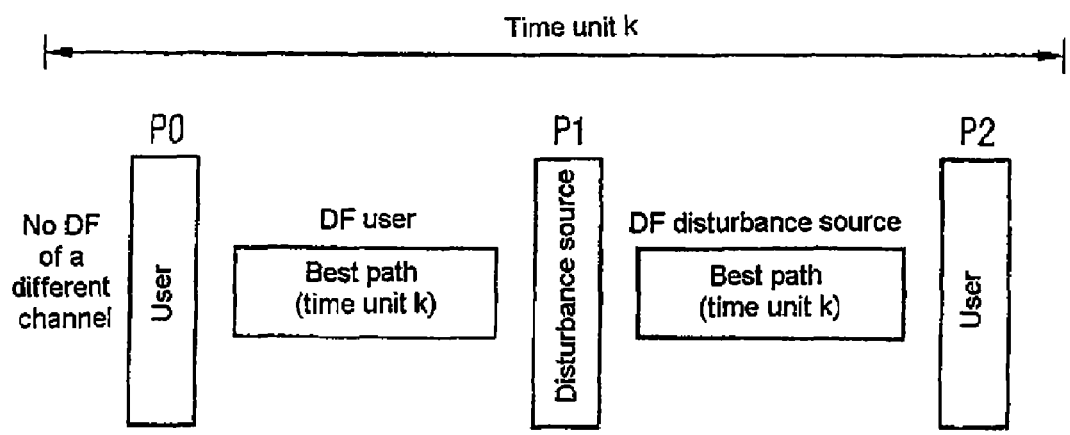
FIG. 4 shows an illustration to explain the processing of useful channel, disturbance channel and useful channel trellis diagrams in the time unit k according to the document DE 103 38 050 A1, which was not published prior to this.
Figure 7:
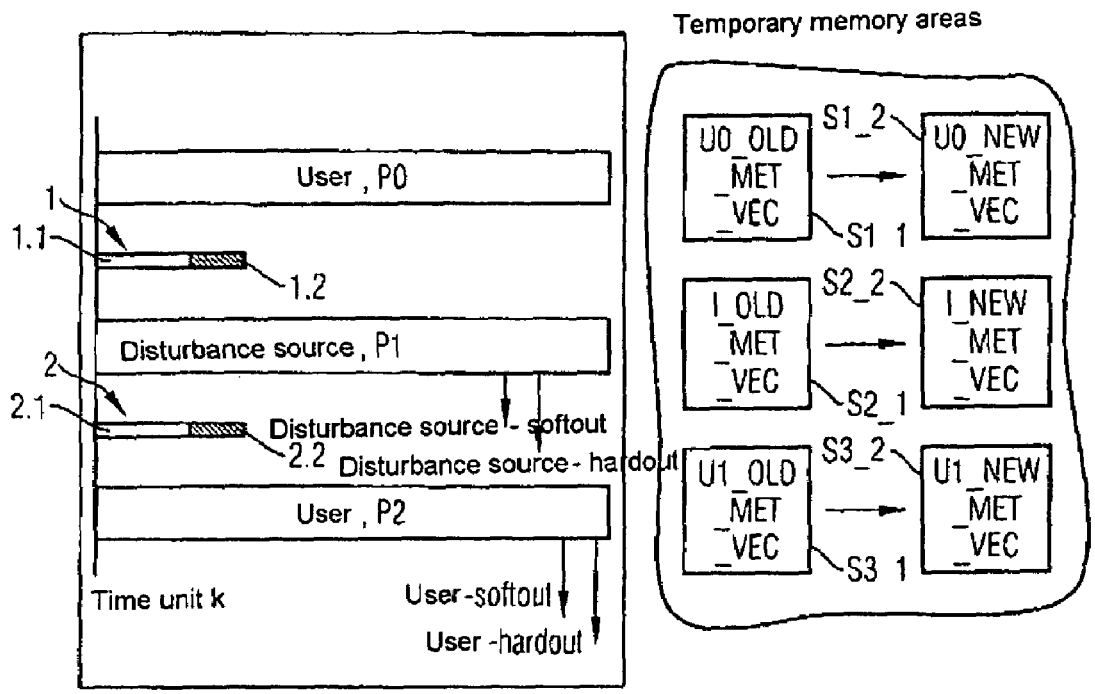
FIG. 7 shows an illustration of processes P0, P1, P2 for processing the trellis diagrams of the useful channel, of the disturbance channel and of the useful channel once again, as well as the accesses that are carried out in the processes to temporary memory areas for writing/reading state metric values and state vectors for the method illustrated in FIG. 4.

FIG. 7 illustrates the equalization method (left-hand part of the figure) illustrated in FIG. 4, and shows the memory accesses required for this purpose (right-hand part of the figure). As already explained, the useful channel is equalized (the process P0), the disturbance channel is equalized (the process P1) and the useful channel is equalized once again (the process P2) in each time unit. The first useful channel equalization (P0) is carried out without any DF contribution of the disturbance channel. The best path of the useful channel trellis diagram is calculated for the current time unit k in the process P0. The best path is that path which leads to the destination state with the lowest state metric (path metric). A leading part (header section) of the best path of the useful channel trellis diagram is used as the DF contribution for the processing of the disturbance channel trellis diagram in the process P1. The disturbance channel trellis diagram for the current time unit k is processed in the process P1, and the best path in the disturbance channel trellis diagram is calculated. A header section of this best path in the disturbance channel trellis diagram (relating to the time unit k) is used as the DF contribution for the process P2 (second processing of the useful channel trellis diagram). Soft output values and hard output values are calculated for each time unit, both in the process P1 and in the process P2.

The other channel DF contributions used for the processes P1 and P2 are illustrated in the form of a graph in the left-hand part of the figure in FIG. 7. The header section 1.2 of the best path 1, which is composed of the trellis bits of the destination state and one or more previous bits, occurs as the other channel DF contribution in the process P1 (disturbance channel equalization). The section 1.1 denotes earlier bits in the best path 1 of the useful channel, which are not considered for the equalization of the disturbance channel. The header section 2.2, as determined in the process P1, for the best path 2 of the disturbance channel occurs as the other channel DF contribution in the process P2 (useful channel equalization). The section 2.1 once again denotes earlier bits in the best path 2 of the disturbance channel which are not taken into account in the equalization of the useful channel.

The length of the best header section 1.2 or 2.2 used as the other channel DF contribution can be selected on the basis of the desired accuracy and the available computation power. Since the best path of the respective other channel is determined in the current time unit, it takes account of the best destination state (that is to say the destination state with the minimum state metric) in the respective other channel.

The following memory accesses are required in each time unit k for the trellis processing operations explained with reference to the left-hand part of the figure in FIG. 7:

Process P0: the old state metric values (U0_OLD_MET) and the old state vectors (U0_OLD_VEC) are called up from a first temporary memory area S1_1, and the newly calculated state metric values (U0_NEW_MET) and state vectors (U0_NEW_VEC) are stored in a second memory area S1_2.

Process P1: the old state metric values (1_OLD_MET) and the old state vectors (I_OLD_VEC) are called up from a first temporary memory area S2_1, and newly calculated state metric values (I_NEW_MET) and state vectors (I_NEW_VEC) are stored in a second memory area S2_2.

Process P2: the old state metric values (U1_OLD-MET) and the old state vectors (U1_OLD_VEC) are called up from a first temporary memory area S3_1, and the newly calculated state metric values (U1_NEW_MET) and state vectors (U1-NEW_VEC) are stored in a second memory area S3_2.

In this case, the expression "old" state metric values or "old" state vectors denotes the state metric values of the previous states in the time unit k and, respectively, the state vectors which lead to the previous states in the time unit k. The expression "new" state metric values or "new" state vectors means the state metric values (calculated during the trellis processing in the time unit k) of the destination states (which are associated with the time unit k+1) and, respectively, the indication of the state vectors associated with the destination states.

This clearly shows that six memory areas S1_1, S1_2; S2_1, S2_2; S3_1, S3_2 are required for the processing of the three trellis diagrams. The memory areas are simply interchanged for the processing of the respective trellis diagrams in the next time unit k+1, that is to say the memory areas S1_2, S2_2 and S3_2 occur in place of the memory areas S1_1, S2_1 and S3_1, respectively, and now produce the old state metric values and state vectors, while the memory areas S1_1, S2_1, S3_1 are deleted and are used for storage of the new state metric values and state vectors (relating to the trellis states for the time unit k+2) calculated in the time unit k+1.

Figure 8:
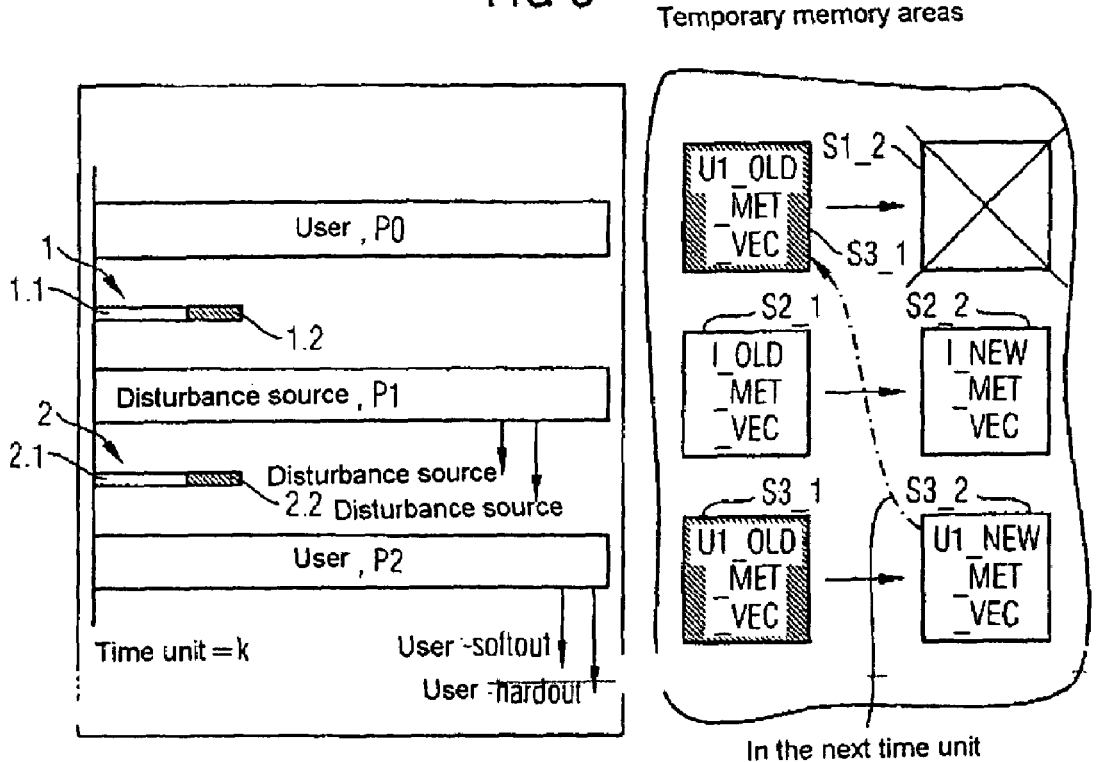
FIG. 8 shows an illustration of processes P0, P1, P2 for processing the trellis diagrams of the useful channel, of the disturbance channel and of the useful channel once again, as well as the accesses, carried out in the processes, to temporary memory areas for writing/reading state metric values and state vectors for one exemplary embodiment of the method according to the first aspect of the invention.

The procedure according to the invention as illustrated in FIG. 8 for equalization of the useful channel differs from the procedure explained with reference to FIG. 7 by modified memory management. The process P0 is not assigned its own separate memory area but is supplied from the respective values U1_NEW_MET and U1_NEW_VEC stored in the memory area S3_2. This means that the temporary storage areas S1_1 and S1_2 are not required for the process P0, and the values U1_NEW_MET and U1_NEW_VEC stored in the temporary memory area S3_2 are available as new output data items U1_OLD_MET or U1_OLD_VEC, respectively, when the process P0 (which is carried out for the next time unit) is carried out. Furthermore, the state metric values U0_NEW_MET and state vectors U0_NEW_VEC determined for the process P0 need not be stored.

In addition to saving memory, the procedure explained with reference to FIG. 8 results in an improvement in the equalization performance: the state metric values U1_OLD_MET and state vectors U1_OLD_VEC used for the process P0 already to a certain extent contain compensation for the disturbance channel influence as a result of the process P1. The use of these values U1_OLD_MET and/or U1_OLD_VEC then also ensure that the disturbance channel influence is reduced in the process P0. This in turn means that the best path 1 calculated in the process P0 is more reliable than the best path 1 calculated in the process P0 in FIG. 7, so that the DF contribution 1.2 used for the disturbance channel equalization in the process P1, for the useful channel is also more reliable for compensation for the disturbance channel influence during the processing of the disturbance channel (the process P1).

In other words, the use of joint temporary memory areas S3_1 and S3_2 for the two useful channel equalization processes P0 and P2 results in the disturbance channel suppression achieved in the useful channel process P2 being transferred to the useful channel process P0, which in turn contributes to improved calculation of the best path 1 in the useful channel and—because the best path 1 of the useful channel is taken into account in the process P1—to improved equalization of the disturbance channel.

It should be noted that the number of states of the useful channel trellis diagram and of the disturbance channel trellis diagram need not be identical. If the memory lengths of the disturbance channel and of the useful channel are greatly different, it is recommended that the number of states in the respective trellis diagrams likewise be chosen to be different. For example, a memory length of 4 time units may be chosen for the disturbance channel (the trellis diagram of the disturbance channel then has 8 states), and a memory length of 5 time units can be chosen for the useful channel (the trellis diagram of the useful channel then has 16 states).

Figure 9:
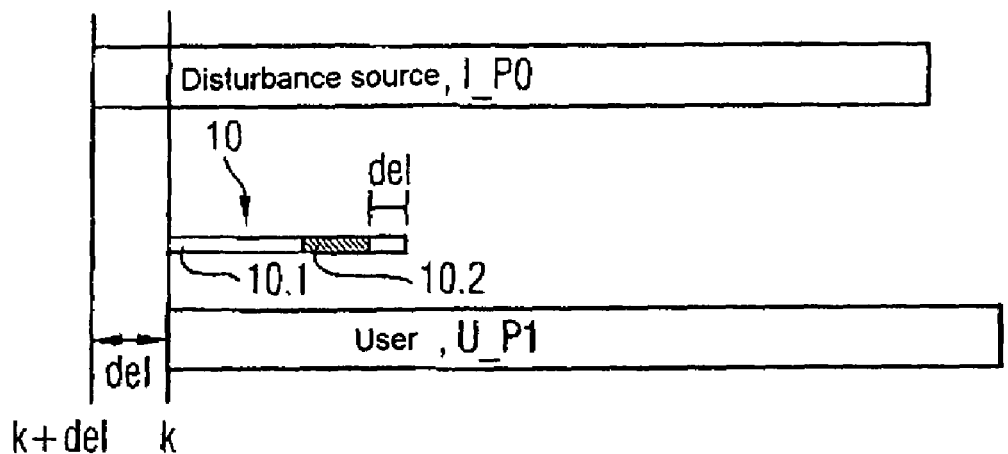
FIG. 9 shows an illustration of processes P0, P1 for processing the trellis diagram of the disturbance channel and for time-offset processing of the trellis diagram of the useful channel for one exemplary embodiment according to the second aspect of the invention.
Figure 10:
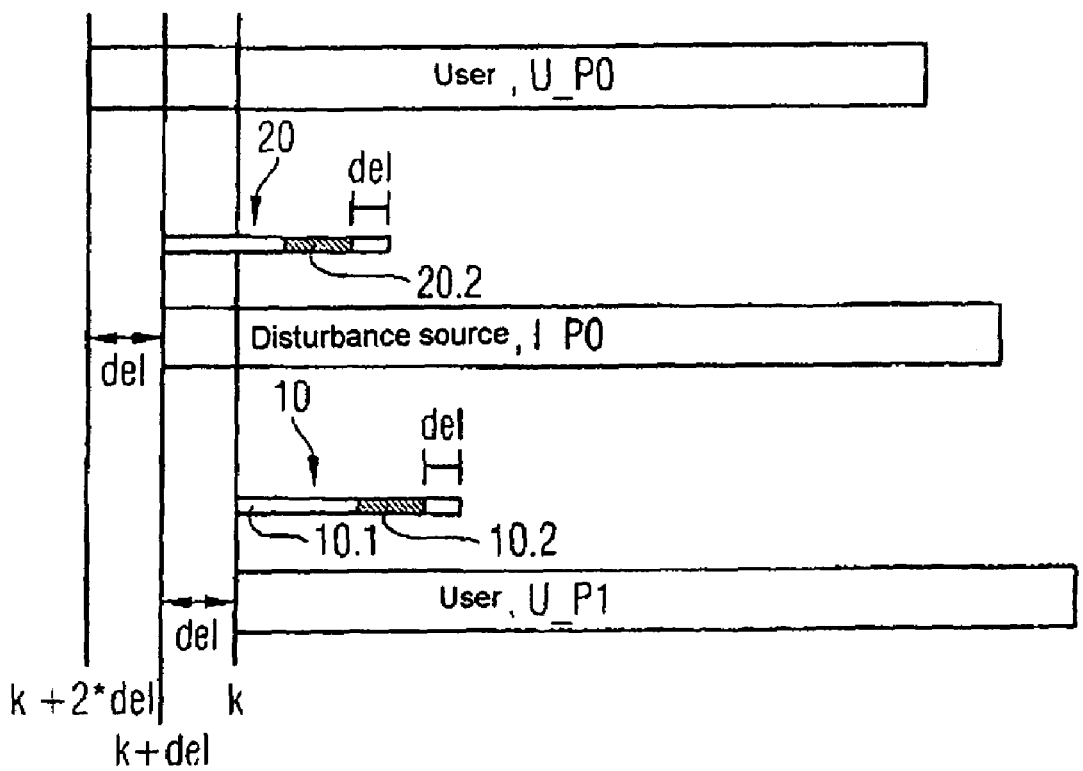
FIG. 10 shows an illustration corresponding to FIG. 9 for the case of time-offset processing of three trellis diagrams.

FIGS. 9 and 10 illustrate the processing of useful channel and disturbance channel trellis diagrams according to the second aspect of the invention.

In this case as well, a plurality of channels (FIG. 9: useful channel and disturbance channel; FIG. 10: useful channel, disturbance channel, useful channel) are processed alternately in each time unit in this case as well, in the process using path information which was obtained during the processing of the trellis diagram for another channel in the form of a DF contribution for the processing of the channel under consideration. The embodiments relating to this for the method according to the first aspect of the invention also apply to the method according to the second aspect of the invention. The major difference between the method according to the first aspect of the invention and the method according to the second aspect of the invention is that, in the case of the latter, the processing of the plurality of trellis diagrams is carried out within one time unit with a time offset del. FIG. 9 explains the procedure for useful channel equalization, in which two trellis diagrams are processed per time unit (see FIG. 3). First of all, the trellis diagram of the disturbance channel is processed without any other channel DF contribution (process I_P0). After a duration of del symbols, the processing of the useful channel starts in the process U_P1. This means that the processing of the useful channel trellis diagram for the time unit k takes place at the same time (that is to say during the same time unit) as the processing of the disturbance channel trellis diagram for the time unit k+del. A section 10.2 of the best path 10 in the disturbance channel trellis diagram is used as the other channel DF contribution for the processing of the useful channel trellis diagram (the process U_P1). The best path 10 is determined in the process I_P0. That section 10.2 which has the same delay del must be obtained from the best path 10 in order to take account of the delayed processing of the useful channel trellis diagram in the process U_P1. This means that the section 10.2 is shifted to the left by del bits relative to the LSB (least significant bit) of the best path 10 (that is to say the path header) (for the general case, p>2: the section 10.2 is shifted by del symbols relative to the least significant symbol). The best path 10 furthermore includes earlier bits (symbols) 10.1 which are not included in the section 10.2.

The time delay del between the processing of the two trellis diagrams allows more reliable determination of the best path 10 in the trellis diagram of the disturbance channel (that is to say in the process I_P0). The extent of the reliability increase in the calculation of the best path 10 depends on the path combination length for the trellis processing, which is in turn dependent on the channel memory of the physical transmission channel.

The processing of the trellis diagram of the useful channel delayed by del time units results in a traceback being carried out for the determination of the best path 10, which is comparable with the traceback step that is known in the VA for determination of the best path. In this case, this traceback is, however, used to obtain the section 10.2 which is used as the other channel DF contribution for the useful channel trellis processing in the process U_P1.

The shifting of the section window by del bits (in general: symbols) ensures that all of the path information obtained in the process I_P0 up to (and including) the time unit k is taken into account in the useful channel equalization for the time unit k.

FIG. 10 shows an exemplary embodiment of the method according to the second aspect of the invention, in which three trellis diagrams are processed per time unit (cf FIG. 4). First of all, the trellis diagram of the useful channel is processed in the normal manner in the process U_P0. After a time delay del, the disturbance channel trellis diagram is processed in the process I_P1, with a useful channel DF contribution 20.2 being used in the manner already described, and with this useful channel DF contribution 20.2 being obtained from that section of the best path 20 as determined in the process U_P0 shifted through del bits (symbols). The processing of the useful channel trellis diagram once again in the process U_P1 is carried out in the manner already explained in FIG. 9.

It should be noted that the processing delays del between the processes U_P0 and I_P0 as well as I_P0 and U_P1 need not necessarily be identical, as is shown in a simplified manner in FIG. 10. If different processing delays are used, this must be taken into account appropriately in the calculation of the DF contributions 10.2, 20.2.

By way of example, values in the range between 1 and 10 time units can be used for the delay del (one bit corresponds to one time unit for GSM, and one symbol which is coded by three bits corresponds to one time unit for EDGE). In many cases, even del=2 or del=4 results in a considerable improvement in the equalization performance.

Figure 11:
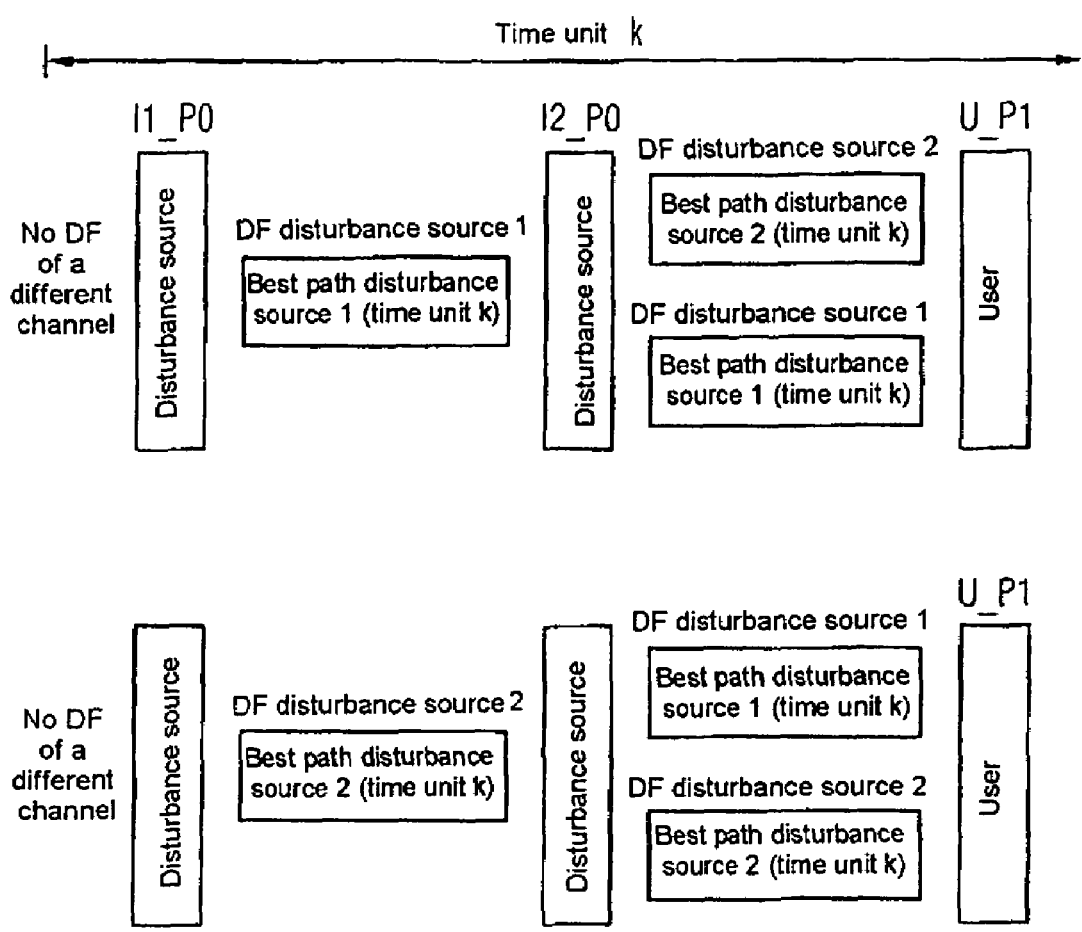
FIG. 11 shows two diagrams in order to explain the processing of the trellis diagram of a first disturbance channel, of a second disturbance channel and the useful channel in the time unit k.

Furthermore, it should be noted that the method explained with reference to FIG. 10 for processing of 3 trellis diagrams in one time unit also makes it possible to take account of two disturbance channels. As shown in FIG. 11, a first disturbance channel trellis diagram, a second disturbance channel trellis diagram and the useful channel trellis diagram are processed in one time unit k. Either the trellis diagram of the first disturbance source is processed first, the best path is determined, the trellis diagram of the second disturbance source is processed using path information extracted from the best path (see the upper part of FIG. 11), or the opposite procedure is adopted (see the lower part of FIG. 11). In both cases, the best path determined for the second processing of a disturbance channel is then either used, as is illustrated in FIG. 10, for the processing of the useful channel trellis diagram in the process U_P1 (not illustrated in FIG. 11), or, as is illustrated in FIG. 11, it is possible to provide for two of the other channel DF contributions to be used for the useful channel trellis processing U_P1, with the first other channel DF contribution being a section from the best path of the trellis diagram of the first disturbance channel, and the second other channel DF contribution being a section from the best path of the trellis diagram of the second disturbance channel.

Figure 12:
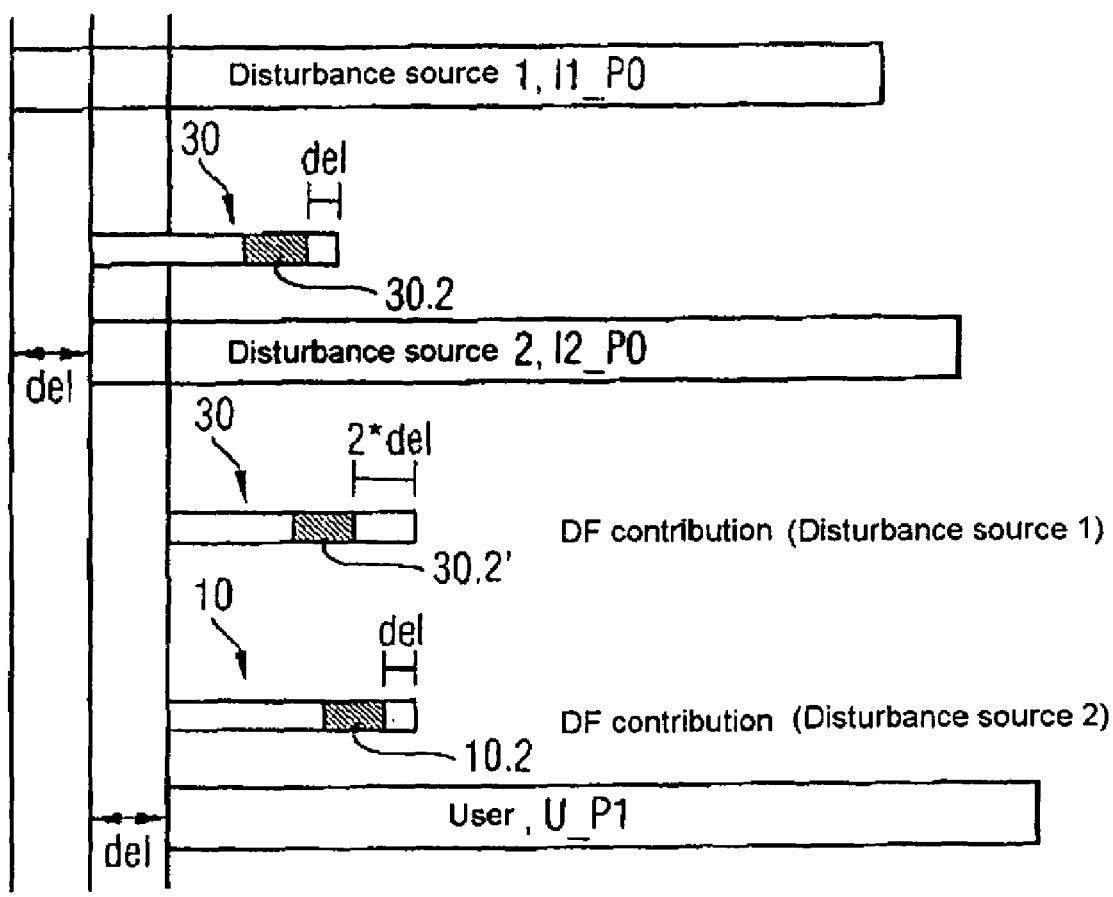
FIG. 12 shows an illustration of the processes for processing the trellis diagrams shown in FIG. 11.

FIG. 12 illustrates the position of the section windows in order to obtain the two other channel DF contributions from the respective best paths for the situation illustrated in the upper part of the figure in FIG. 11. The best path 30, determined in the process I1_P0, of the first disturbance channel is used for two calculations. The processing delay of del between the two processes is taken into account for determination of the DF contribution 30.2, provided for the process I2_P0, from the best path 30, as already explained. The processing delay of 2*del between the two processes must be taken into account for determination of the DF contribution 30.2', provided for the process U_P1, from the best path 30. Otherwise, the statements relating to FIGS. 9 and 10 apply analogously.

The method according to the first aspect of the invention (that is to say the use of a joint temporary memory area for the processes U_P0 and U_P1) cannot be used for the useful channel, disturbance channel, useful channel equalization illustrated in FIG. 10, because of the processing delay between the processes U_P0 and U_P1. One exemplary embodiment of the invention will be described in the following text with reference to FIGS. 13 and 14, which combines the first aspect of the invention with the second aspect of the invention.

Figure 13:
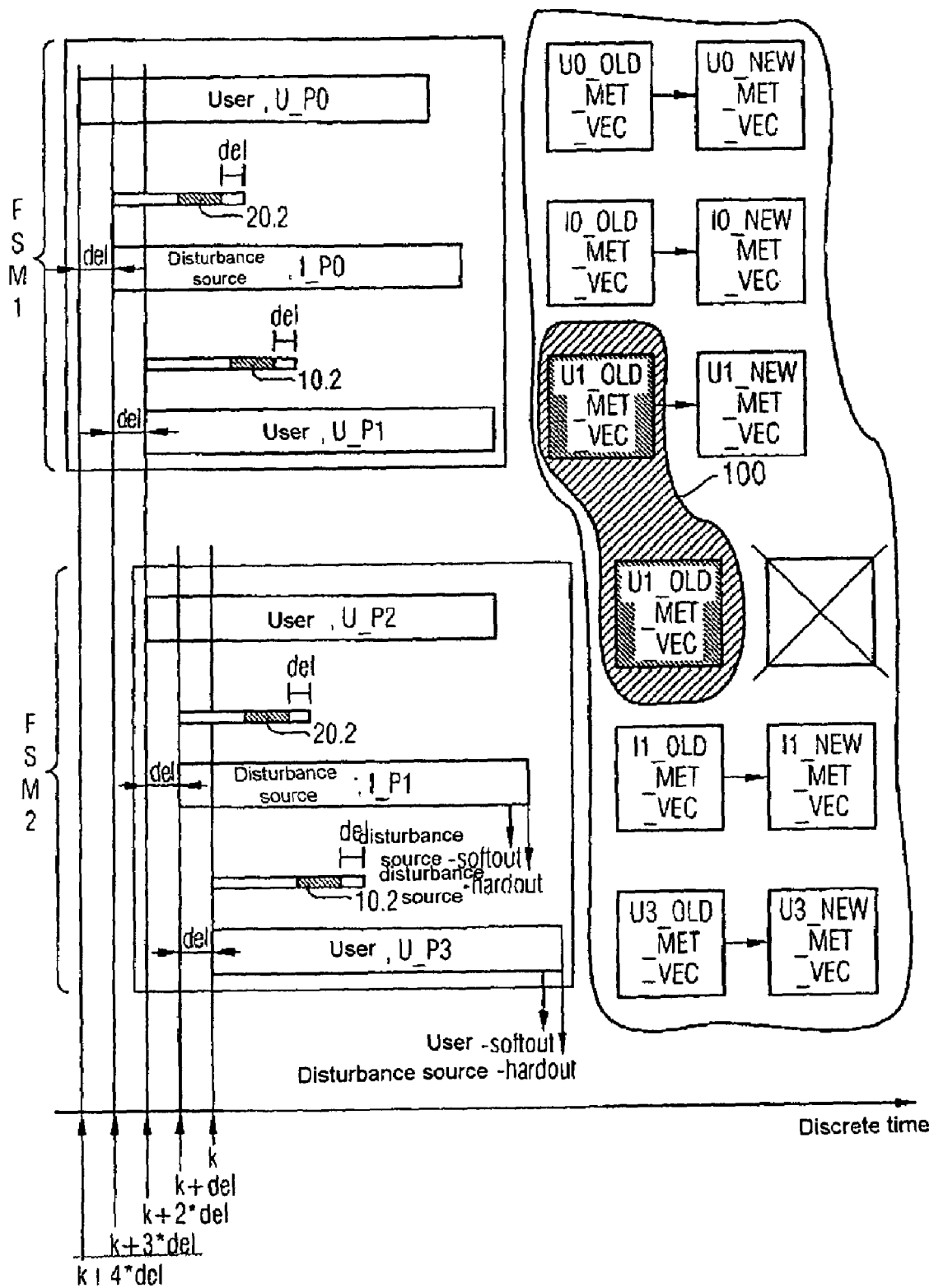
FIG. 13 shows an illustration of a method variant, which comprises both the use of identical memory areas for the processing of two useful channel trellis diagrams according to the first aspect of the invention and time-offset processing of trellis diagrams according to the second aspect of the invention, per time unit.

In the method variant illustrated in FIG. 13, six trellis diagrams are processed per time unit. In this case, a finite state machine 1 (FSM1) is used to carry out the processes shown in FIG. 10 a first time, and a finite state machine 2 (FSM2) is used to carry out the same processes once again.

This results in the following time procedure for the time unit k:

Process U_P0: useful channel trellis processing for the sample value received in the time unit k+4*del;

Process I_P0: disturbance channel trellis processing for the sample value received in the time unit k+3*del;

Process U_P1: useful channel trellis processing for the sample value received in the time unit k+2*del;

Process U_P2: useful channel trellis processing for the sample value received in the time unit k+2*del;

Process I_P1: disturbance channel trellis processing for the sample value received in the time unit k+del; and Process U_P3: useful channel trellis processing for the sample value received in the time unit k.

Since the useful channel trellis processing operations U_P1 and U_P2 occur at the same time, these two processes may, according to the first aspect of the invention, jointly use the same temporary memory area. This is illustrated by the border 100 in FIG. 13. Furthermore, no write operations are required in the process U_P2 since, in precisely the same way as in the case of the process U_P1—this makes use, in the manner already described, of the metric values U1_OLD_MET and state vectors U1_OLD_VEC calculated by the process U_P1 for the processing of the trellis diagram in the next time unit. The purpose of the finite state machine 2 is thus to use the corrected state metric values U1_OLD_MET and state vectors U1_OLD_VEC for the second iteration of the useful channel and disturbance channel processing operations U_P2, I_P1 and U_P3.

The method variant illustrated in FIG. 13 firstly results in the disturbance channel suppression being transferred from the process U_P1 to the process U_P2—that is to say between the finite state machine 1 and the finite state machine 2—according to the first aspect of the invention, and, according to the second aspect of the invention, this results secondly for each finite state machine in an improvement in the reliability of the calculation of the other channel DF contributions as a result of the time offset del and of the traceback operation that is required for this purpose for determination of that section of the best path which is applicable to the next process and is used as the other channel DF contribution there.

Figure 14:
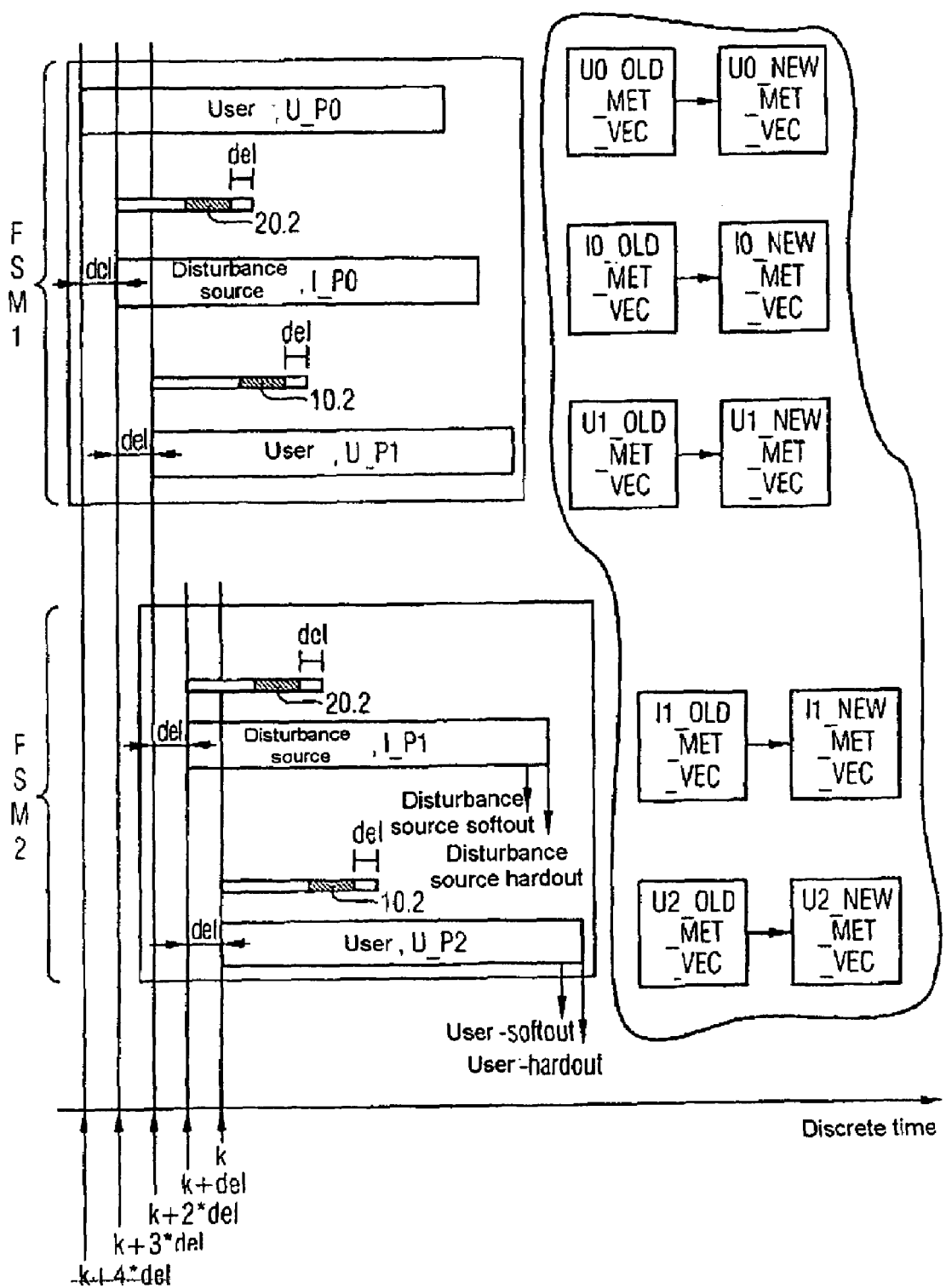
FIG. 14 shows an illustration of how a simplified method is carried out, of the method variant shown in FIG. 13.

The method variant illustrated in FIG. 13 can be simplified according to the illustration in FIG. 14. In FIG. 14, the finite state machine 2 comprises only the trellis processing of the disturbance channel (the process I_P1) and the trellis processing of the useful channel U_P2 (which corresponds to the process U_P1 in FIG. 9). The process U_P1 of the finite state machine 1 in this case directly generates the other channel DF contribution for the disturbance channel trellis processing in the process I_P1.

According to FIG. 14, five trellis diagrams must be processed per time unit. Compared with the factor of 16 which occurs in the processing of the overall trellis diagram, a significant reduction in complexity is still achieved in the case of a trellis diagram comprising 16 states. As soon as trellis diagrams with a greater number of states (for example 32 or 64) are considered, the potential saving is increased in a corresponding manner (compare the factor 5 with the factors of 32 and 64, respectively). Furthermore, it should be noted that only a very minor increase in the memory area, which is insignificant for practical implementation purposes, is required. A memory area of 5 (the number of trellis diagrams to be processed)×2 (state metric values and state vectors)×16 (states)×16 (word length)=2560 bits may be provided for a trellis diagram with 16 states. Particularly when using dual-port RAMs for this purpose, the increase in the memory chip area required is very small.

The described processes can be implemented in known systems for processing of trellis diagrams (that is to say in known Viterbi equalizers). In this case, it is possible to use not only software-based systems in which the calculation of the branch metric values is carried out by a CPU during the trellis processing operations described above, but also hardware-based systems, in which the ACS operations are carried out by hard-wired modules or data paths in the processor.

What is claimed is:

1. A method for equalization of a signal which is transmitted via a useful channel using a decision feedback (DF) method and taking into consideration at least one disturbance channel, per unit time comprising:
   (a) processing, by a processor, a trellis diagram of the useful channel;
   (b) processing, by the processor, a trellis diagram of the disturbance channel, with a DF contribution which is used in the processing of the trellis diagram of the disturbance channel containing information, determined in step (a), of the useful channel;
   (c) processing, by the processor, the trellis diagram of the useful channel being once again, with a DF contribution, which was used when the trellis diagram of the useful channel was processed once again, containing information, determined in step (b), of the disturbance channel; and
   wherein input information being accessed in step (a) during the processing of the trellis diagram of the useful channel, which input information was determined when the trellis diagram of the useful channel was processed once again in step (c) in a previous time unit.

2. A method according to claim 1, wherein the input information relates to path information and/or state metric values.

3. A method according to claim 1, wherein the input information which was calculated during the processing of the trellis diagram of the useful channel in step (a) is rejected without being stored.

4. A method according to claim 1, wherein steps carried out in one time unit k comprise:
   in step (b), reading state metric values and/or path information relating to previous states of the trellis diagram of the disturbance channel from a first disturbance channel memory area, and writing calculated state metric values and/or path information relating to destination states of the trellis diagram of the disturbance channel to a second disturbance channel memory area;
   in step (c), reading state metric values and/or path information relating to the previous states of the trellis diagram of the useful channel from a first useful channel memory area, and writing calculated state metric values and/or path information relating to the destination states of the trellis diagram of the useful channel to a second useful channel memory area; and the step carried out in the next time unit k+1:
   in step (a), reading state metric values and/or path information relating to the previous states of the trellis diagram of the useful channel from the second useful channel memory area.

5. A method according to claim 1, wherein the information, determined in step (a), of the useful channel is the best path in the useful channel trellis diagram for that time unit for which the trellis diagram of the disturbance channel is processed in step (b).

6. A method according to claim 1, wherein the information, determined in step (b), of the disturbance channel is the best path in the disturbance channel trellis diagram for that time unit for which the trellis diagram of the useful channel is processed in step (c).

7. A method for equalization of a signal which is transmitted via a useful channel using a decision feedback (DF) method and taking into consideration at least one disturbance channel, per time unit comprising:
   (a) processing, by a processor, a trellis diagram of the disturbance channel being for a time unit under consideration;
   (b) processing, by the processor, a trellis diagram of the useful channel for the time unit delayed by a first predetermined time delay with respect to the time unit under consideration, with a DF contribution which was used during the processing of the trellis diagram of the useful channel including path information of the disturbance channel which was determined in step (a) and occurred at a time equivalent to at least the first predetermined time delay before the time unit under consideration.

8. A method according to claim 7, wherein
   in a step (i) before the step (a), either the trellis diagram of the useful channel is processed for the first time, or a trellis diagram of a further disturbance channel is processed for the time unit which preceded the time unit under consideration by a second predetermined time delay; and
   in step (a), a DF contribution which was used during the processing of the trellis diagram of the disturbance channel includes path information, which was determined in step (i) and occurred at a time equivalent to at least the second predetermined time delay before the time unit under consideration, of the channel (useful channel or further disturbance channel) processed in step (i).

9. A method according to claim 7, wherein a decision feedback (DF) contribution which was used during the processing of the trellis diagram of the useful channel includes the path information which occurred at a time equivalent to exactly the first predetermined time delay before the time unit under consideration, for the disturbance channel.

10. A method according to claim 8, wherein the first and/or the second predetermined time delay is between 1 and 10 time units, in particular between 2 and 4 time units.

11. A method according to claim 8, furthermore comprising, per time unit and before carrying out steps (a) and (b):
   (a0) processing, by the processor, a trellis diagram of the disturbance channel for another time unit under consideration, which occurs later than the time unit under consideration;
   (b0) processing, by the processor, a trellis diagram of the useful channel for the time unit which is delayed by a third predetermined time delay with respect to the other time unit under consideration, with a DF contribution which was used during the processing of the trellis diagram of the useful channel including path information, which was determined in step (a0) and occurred at a time equivalent to at least the third predetermined time delay, for the disturbance channel,
   wherein the processing of the trellis diagram of the useful channel in step (b0) precedes the processing of the trellis diagram of the disturbance channel in step (a) by a fourth predetermined time delay, and
   in that a DF contribution, which was used during the processing of the trellis diagram of the disturbance channel for the time unit under consideration in step (a), includes path information, which was determined in step (b0) and occurred at a time equivalent to at least the fourth predetermined time delay before the time unit under consideration, for the disturbance channel.

12. A method according to claim 7, wherein before carrying out step (a0), the trellis diagram of the useful channel is processed for a time unit which occurs later than the time unit considered in step (a0), with a DF contribution which was used during the processing of the trellis diagram of the disturbance channel in step (a0) including path information, which was determined during this processing of the trellis diagram of the useful channel and occurred at a time equivalent to at least a fourth predetermined time interval before the time unit under consideration, for the useful channel.

13. A method according to claim 11, wherein the first, second, third and fourth predetermined time delays are identical.

14. A system for equalization of a signal which is transmitted via a useful channel using a decision feedback (DF) method and taking into consideration at least one disturbance channel, comprising:
   a processor configured to:
      process a trellis diagram of the useful channel per time unit;
      process a trellis diagram of the disturbance channel per time unit, with a DF contribution which is used in the processing of the trellis diagram of the disturbance channel containing information, determined in step (a), of the useful channel;
      process the trellis diagram of the useful channel being once again per time unit, with a DF contribution which was used when the trellis diagram of the useful channel was processed once again, containing information, determined by the means for processing a trellis diagram of the disturbance channel; and
   access input information during the processing of the trellis diagram of the useful channel, which input information was determined when the trellis diagram of the useful channel was processed once again in a previous time unit.

15. A system according to claim 14, wherein the input information relates to path information and/or state metric values.

16. A system according to claim 14, wherein input information which was calculated during the processing of the trellis diagram of the useful channel is rejected without being stored.

17. A system according to claim 14, further comprising a reader configured to:

read state metric values and/or path information relating to a previous state of the trellis diagram of the disturbance channel from a first disturbance channel memory area in one time unit k, and write calculated state metric values and/or path information relating to destination states of the trellis diagram of the disturbance channel to a second disturbance channel memory area;

read state metric values and/or path information relating to the previous states of the trellis diagram of the useful channel from a first useful channel memory area in one time unit k, and write of calculated state metric values and/or path information relating to the destination states of the trellis diagram of the useful channel to a second useful channel memory area; and read state metric values and/or path information relating to the previous states of the trellis diagram of the useful channel from the second useful channel memory area in a following time unit k+1.

18. A system according to claim 14, wherein the information of the useful channel is the best path in the useful channel trellis diagram for that time unit for which the trellis diagram of the disturbance channel is processed.

19. A system according to claim 14, wherein the information of the disturbance channel is the best path in the disturbance channel trellis diagram for that time unit for which the trellis diagram of the useful channel is processed.

* * * * *

UNITED STATES PATENT AND TRADEMARK OFFICE
CERTIFICATE OF CORRECTION

PATENT NO.       : 7,627,062 B2                                    Page 1 of 1
APPLICATION NO. : 11/359017
DATED            : December 1, 2009
INVENTOR(S)      : Burkhard Becker It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 891 days.

Signed and Sealed this

Second Day of November, 2010

David J. Kappos
*Director of the United States Patent and Trademark Office*

UNITED STATES PATENT AND TRADEMARK OFFICE
CERTIFICATE OF CORRECTION

PATENT NO. : 7,627,062 B2
APPLICATION NO. : 11/359017
DATED : December 1, 2009
INVENTOR(S) : Burkhard Becker It is certified that error appears in the above-identified patent and that said Letters Patent is hereby corrected as shown below:

At column 18, line 50, Claim 14, delete "comprising:" and insert -- comprising -- therefor.

Signed and Sealed this

Thirtieth Day of November, 2010

David J. Kappos
*Director of the United States Patent and Trademark Office*